United States Patent [19]
Gusinov et al.

[11] Patent Number: 5,440,273
[45] Date of Patent: Aug. 8, 1995

[54] RAIL-TO-RAIL GAIN STAGE OF AN AMPLIFIER

[75] Inventors: Alex Gusinov, Brighton; Moshe Gerstenhaber, Newton, both of Mass.

[73] Assignee: Analog Devices Inc., Norwood, Mass.

[21] Appl. No.: 252,677

[22] Filed: Jun. 2, 1994

[51] Int. Cl.6 .............................................. H03F 3/30
[52] U.S. Cl. .................................... 330/267; 330/263
[58] Field of Search ................ 330/263, 265, 266, 267, 330/268

[56] References Cited

U.S. PATENT DOCUMENTS

| | | | |
|---|---|---|---|
| 4,218,638 | 8/1980 | Breithaupt | 330/263 X |
| 4,570,128 | 2/1986 | Monticelli | 330/267 |
| 5,140,280 | 8/1992 | Vyne et al. | 330/255 |
| 5,153,529 | 10/1992 | Koda et al. | 330/295 |
| 5,162,751 | 11/1992 | Blanken et al. | 330/255 X |

FOREIGN PATENT DOCUMENTS 302109  12/1990  Japan ..................................... 330/268

Primary Examiner—James B. Mullins
Attorney, Agent, or Firm—Samuels, Gauthier & Stevens

[57] ABSTRACT

A gain stage for use in an amplifier which provides a rail-to-rail output signal. The gain stage includes a first transistor having a base, an emitter and a collector, the base being coupled to an input signal applied to the gain stage and the emitter being coupled to a first source of operating potential; a second transistor having a base, an emitter and a collector, the collector being coupled to the collector of the first transistor for providing the output signal, the emitter being coupled to a second source of operating potential; and a third transistor having a base, an emitter and a collector, the emitter being coupled to the input signal, the base being coupled to a bias voltage, and the collector being coupled to the second operating potential and the base of the second transistor for providing a drive signal thereto allowing the output signal to swing substantially between the first and second sources of operating potential.

31 Claims, 1 Drawing Sheet

RAIL-TO-RAIL GAIN STAGE OF AN AMPLIFIER

BACKGROUND OF THE INVENTION

The invention relates in general to amplifiers, and more specifically to a rail-to-rail gain stage of an amplifier.

Amplifiers are widely utilized in the electronics industry for both amplifying and buffering an input signal and providing an output signal. Of particular interest in industry is to operate the amplifier with a maximum swing between a given set of supplies, and to be able to operate to very low supplies. This function is referred to as rail-to-rail performance in accordance with the operation of the device between the positive and negative voltage supply rails.

A conventional operational amplifier is described in U.S. Pat. No. 5,140,280, which presents a rail-to-rail output stage of an operational amplifier. The output stage of this operational amplifier includes two output transistors, one being a NPN and the other a PNP transistor. The NPN output transistor is driven by an emitter follower configuration, while the PNP output transistor is driven by a current mirror configuration. One observation of such a configuration is that the output drive is not truly symmetrical. In devices which utilize a mirror type of output configuration, there is a limitation on how much current it can source or sink based on the ratio of the transistors in the mirror.

It is therefore an object of the present invention to provide an amplifier gain stage which processes signals operating substantially at the power supply rails.

It is a further object of the present invention to provide a gain stage which is capable of low voltage operation.

It is another object of the present invention to provide a gain stage with a compact design having relatively few transistors in the signal path.

It is yet another object of the present invention to provide a gain stage which has the ability to sink and source large currents while operating on a small bias current.

SUMMARY OF THE INVENTION

Accordingly, the present invention provides a gain stage for use in an amplifier which provides an output signal. The gain stage includes a first transistor having a base, an emitter and a collector, the base being coupled to an input signal applied to the gain stage and the emitter being coupled to a first source of operating potential; a second transistor having a base, an emitter and a collector, the collector being coupled to the collector of the first transistor for providing the output signal, the emitter being coupled to a second source of operating potential; and a third transistor having a base, an emitter and a collector, the emitter being coupled to the input signal, the base being coupled to a bias voltage, and the collector being coupled to the second operating potential and the base of the second transistor for providing a drive signal thereto allowing the output signal to swing substantially between the first and second sources of operating potential.

The gain stage of the present invention allows operation of 2 Vbe and one saturation voltage to be the minimum supply voltage, which in most processes is 2 volts or less, thus allowing for operation under very low voltage supply conditions.

The gain stage of the present invention includes a relatively simple circuit schematic and a very compact method of operating on low supplies, while maintaining a good control of the output current, which is typically hard to maintain. The present invention achieves this with common emitter type output devices, one being a PNP transistor coupled to the positive supply rail, and the other being a NPN transistor tied to the negative supply rail.

The present invention further accommodates the utilization of conventional fabrication processes that are becoming very popular in the industry, such as processes that use NPN and PNP complementary bipolar processing. With more companies taking advantage of these processes, it is important to take specific advantage of the functionality of both NPN and PNP transistors for a high speed low power supply operation.

A specific advantage of the gain stage of the present invention is the difference in topology with respect to conventional gain or output stages. The output devices of the present invention are not being configured in a mirror type of configuration where there is a limitation on how much current it can source or sink based on the ratio of the transistors in the mirror.

DETAILED DESCRIPTION OF THE ILLUSTRATED EMBODIMENTS

Figure 1:
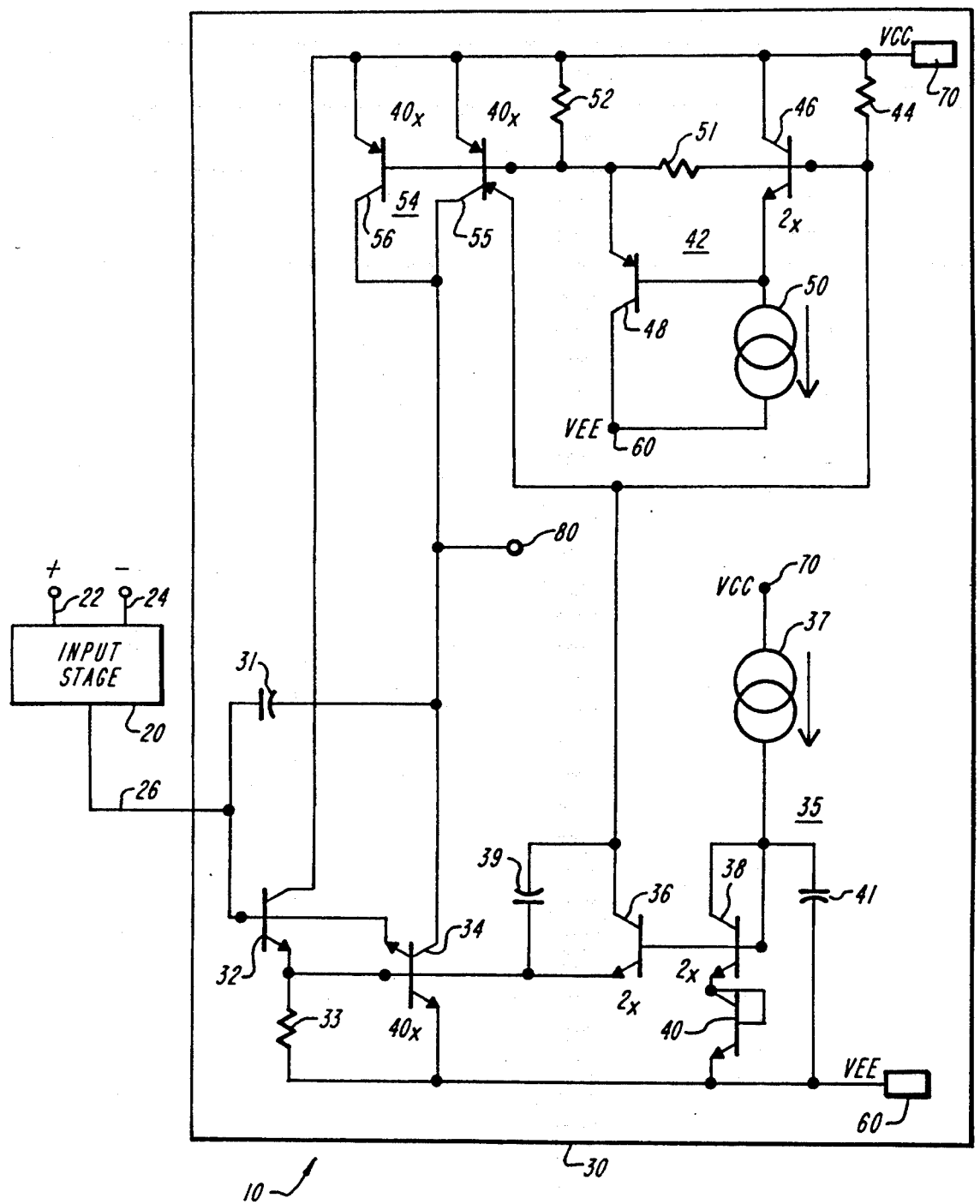
FIG. 1 shows a circuit schematic of the gain stage in accordance with the present invention.

FIG. 1 shows a block diagram of an operational amplifier 10 in accordance with the present invention. The operational amplifier 10 includes an input stage 20 and a gain stage 30. The input stage 20 is, for example, any gm stage taking a differential input voltage across input nodes 22 and 24 and providing an output current which will drive the input node 26 of the gain stage 30. It will be appreciated by those of skill in the art that the gain stage 30 can be used as the output stage of the amplifier 10, and that the gain stage can be used in any amplifier circuitry. The gain stage 30 is described herein as part of an operational amplifier for illustrative purposes only.

The gain stage 30 is responsive to the current developed by the transconductance of the input stage 20 and delivered to node 26 for providing a rail-to-rail output signal for the operational amplifier 10. Node 26 is connected to a follower NPN transistor 32 that serves to drive the base of NPN transistor 34 and the emitter of NPN transistor 36.

The emitter of transistor 32 is further coupled via resistor 33 to the negative supply rail 60, while the collector is coupled to the positive supply rail 70. In an exemplary embodiment, the resistor 33 has a value of 2K ohms. The transistor 34 is configured as a 40× device with the emitter being connected to the negative supply rail and the collector being coupled to the output node 80. The transistor 34 has a smaller second emitter which coupled to the base of transistor 32.

Transistor 36 is configured as a 2× device and is coupled through its base to a translinear bias voltage source 35. The voltage source 35 includes a NPN transistor 38 configured as a 2× device with its base being coupled to the base of transistor 36 and to a current source 37 which is tied to the positive supply rail 70. The collector of transistor 38 is coupled to a node which ties to the current source 37, and its base, and further to the negative supply rail through a capacitor 41. The voltage source also includes a transistor 40 having its emitter coupled to the negative supply rail, and its base and collector being tied to the emitter of transistor 38.

The collector of transistor 36 is coupled to voltage buffer circuitry 42. The voltage buffer includes a resistor 44 tied to the positive supply rail 70. In an exemplary embodiment, the resistor 44 has a value of 10K ohms. The bottom of the resistor 44 is tied to the base of NPN transistor 46 which is configured as a 2× device. The collector of transistor 46 is coupled to the positive supply rail 70, and the emitter is coupled to both a current source 50 which in turn is tied to the negative supply rail 60 and the base of PNP transistor 48. The collector of transistor 48 is coupled to the negative supply rail 60, and the emitter is coupled to the base of transistor 46 through resistor 51, and is further coupled to the positive supply rail 70 through resistor 52.

The base of transistor 46 and the emitter of transistor 48 are further coupled to the base of a net transistor 54. The net transistor 54 includes PNP transistor 55 and PNP transistor 56, both of which are configured as 40× devices. The emitters of transistors 55, 56 are tied directly to the positive supply rail 70. A second smaller emitter of the transistor 55 is coupled to both the collector of transistor 36 and the resistor 44. The collectors of transistors 55, 56 are tied together at the output node 80.

The transistor 32, configured as a follower, drives transistors 34 and 36, transistor 36 being in a common base configuration so as to deliver the same polarity signal to the base of transistor 54 as to the base of transistor 34. The NPN output device in the form of transistor 34 has a collector current which is defined by the translinear bias voltage source 35, where the collector current of transistor 36 is Vbe divided by the resistance value of resistor 44. The PNP output device in the form of transistor 54 is forced to provide the same collector current as transistor 34, when the output drive is zero current.

An exemplary AC signal flow is as follows. The node 26 increases in voltage due to a current being injected into the node. The potential on the emitter of transistor 32 will rise, thus forcing the base of transistor 34 to rise, and the collector current of transistor 34 to increase. At the same time, the emitter potential of transistor 36 will increase because it is in a common base configuration. Accordingly, the transistor 36 collector current will decrease and it's collector voltage will rise. Thereafter, with respect to the two follower transistors 46 and 48, the voltage will rise at the emitter of transistor 48, thus decreasing the collector current of transistor 54. Hence, the transistor 34 current has increased, the transistor 54 current has decreased, and the output signal at node 80 is forced to go down.

Accordingly, the polarity of the gain stage is inverting. In other words, an increase in voltage at node 26 causes a decrease in voltage at the output 80, and conversely a decrease in the voltage at node 26 causes the output voltage to go up at node 80. The polarity of the signal through the gain stage 30 is thus described. However, critical to the operation of the gain stage is the way that the biasing is set up. In other words, it is essential to control the DC bias current flowing through output transistors 34 and 54, and maintain a known level of current there, under zero signal condition, when not supplying current from the output into a load.

The aforementioned current is established as follows. Assuming that transistor 54 is on, in other words, at its base, the voltage is 1 Vbe below the positive supply 70 under zero signal condition. Also assume that transistor 48 is on, so its base is 2 Vbe below the positive supply 70 under zero signal condition. Transistor 46 will also be on because current source 50 is supplying current into its emitter. So the voltage at the base of transistor 46 has to be 1 Vbe down from the positive supply in order for transistor 54 to be on. This configuration defines the amount of current that has to flow through resistor 44. In other words, 1 Vbe divided by the value of resistor 44 is the amount of current that must be flowing through resistor 44 to turn on transistor 54.

The manner in which resistor 44 gets its current is from transistor 36 is described as follows. Transistors 34, 36, 38 and 40 form a translinear loop where the transistors 36, 38, 40 have a defined current, and therefore the current of transistor 34 is defined. The reason that three of the transistors have a defined current is due to the fact that a current is forced into transistors 38 and 40, setting up a voltage 2 Vbe above the negative supply 60. Because of the feedback polarity of the gain stage, transistor 36 is forced to supply a current 1 Vbe divided by the resistance value of resistor 44. Therefore, the current of transistor 34 is defined in the translinear loop by the area of the four transistors 34, 36, 38 and 40, and by the current in three of the transistors 36, 38, 40, or can be described as a current density in those three transistors, setting the current density of transistor 34.

Assuming that transistor 54 is on, three out of the four previously described transistors are defined, in terms of how much current is flowing through them, so therefore it leaves only one specific value that transistor 34 must be operating at in order to meet that original assumption. If such an assumption is made that transistor 34 is biased at the current that is defined by the translinear loop, then the current in transistor 34 will be matched by the current in transistor 54, mainly because the DC gain from the base of transistor 34 to the base of transistor 46 is high. Therefore, it will take a very small change in the base voltage of transistor 34 to force transistor 54 to provide the same current as is provided by transistor 34. Because that small change will not change the current in transistors 34 and 36 substantially, the loop will force transistor 54 to source exactly the same amount of current that transistor 34 is sinking, and hence the loop is under control and defined.

For illustrative purposes, if the currents and the dimensions of the transistors are compared, it is seen that transistors 36 and 38 are both 2× devices. Since transistor 36 is operating at about the same current, and hence the same current density as transistor 38, its Vbe will be that of transistor 38. Accordingly, the ratio is set up by transistor 40, which is operating at 60 micramps and is a 1× and transistor 34, which is a 40× device. Since their area ratio is equal to 40, transistor 34 is going to be operating at 40 times the current that transistor 40 is operating at, or approximately 2.4 milliamps. Accordingly, that is how a 2 milliamp current is set in transistor 34, and it follows that transistor 54 is going to supply 2 milliamps to match it.

A capacitor 31 connected from the base of transistor 32 to the output node 80 serves to put the entire gain stage in an integrating mode and sets the bandwidth of the operational amplifier 10. If it is assumed an input stage with a transconductance gm is connected to node 26, and a capacitor of 0.6 picofarads from node 26 to the output node 80, the unity gain bandwidth of the amplifier is set up as being equal to gm divided by 2π(0.6 pF) in Hz.

The second smaller emitter of transistor 34 is used as a saturation clamp. The smaller second emitter is connected back to node 26, thus preventing transistor 34 from going into deep saturation so that transistor 34 will recover more quickly. The same technique is used in transistor 54, there is a second emitter associated with transistor 55 that is connected back to the base of transistor 46 so as to provide a saturation clamp so that transistor 54 cannot go deep into saturation.

It will be appreciated that because of the smaller current carrying capabilities of PNPs, the transistor 34 is configured as one 40× device, whereas the PNP transistor 54 is formed out of two 40× transistors 55, 56 so that each carry half the current of transistor 34. This is necessary because PNP transistors cannot supply as much current as NPN transistors, so therefore a larger device is necessary. In this implementation, a feedback element for the saturation clamp has only been taken from one of the transistors because transistors 55 and 56 are connected in parallel. The transistor 56 is doing exactly the same thing as transistor 55 so there is no need to provide the secondary clamp.

The basic operation of voltage buffer 42 from the base of transistor 46 to the base of transistor 54 is to be able to drive transistor 54, in other words to sink current that is going to be coming out of the base of transistor 54 under high output current condition and still remain in the same linear region of operation for all the other transistors. If the collector of transistor 36 was connected to resistor 44 and also directly shorted to the base of transistor 54, it would in essence provide the same functional description, but would have a problem under cases where large currents were being supplied by transistor 54 and large base currents came out of its base. Transistor 36 being biased at relatively light currents like 60 or 80 microamps, would not be able to sink large currents, so therefore the voltage buffer allows an extra β of driving capability to drive transistor 54, assuming that current source 50 is also about 80 microamps. The situation where the limitation occurs now would be when, for example, 100 milliamps was being supplied by the net transistor 54 and β=100, which would result in 1 milliamp of current coming out of the base of transistor 54. This one milliamp would easily go into the emitter of transistor 48, and the net effect would be if transistor 48's β was also 100, only 10 micramps coming out of its base, therefore not shutting off transistor 46 because it is running at about 120 microamps from the current source 50. Therefore, you have a gain of one from the base of transistor 46 to the base of transistor 54 with a lot of current handling capability, mainly being able to sink current coming out of the base of transistor 54.

Resistor 51 provides some degree of compensation under high current conditions so that the entire loop remains stable and does not oscillate. A second means that may be done in parallel to this resistor or as a separate methodology for keeping the loop stable is to put a capacitor from the emitter to the collector of transistor 36. This capacitor 39 will provide the feedforward compensation so that essentially the signal voltage that is present at the base of transistor 34 is going to be fed forward by the capacitor to the base of transistor 46. Then the only phase loss will be through the two followers transistors 46 and 48, so essentially the same polarity and amplitude signal will be delivered to transistor 54, and therefore the loop will remain stable because there are not any components that are causing a significant phase loss to occur in the response of this stage.

Resistor 52 functions as a current source to set up a minimum amount of current in transistor 48 under conditions of negligible output current and high β of transistor 54. A Vbe across resistor 52 sets up a current that goes into the emitter of transistor 48 so that it is operating at a normal current for reasonable performance.

Resistor 33 is a current source because it has a Vbe across it. The current that is generated in this resistor is much larger than the current that is needed to go through transistor 36. In an exemplary embodiment, the current through resistor 33 is five times larger than the current that is going to be going through transistor 36 under normal conditions, which means that 4/5ths of the current in resistor 33 is going to go up through transistor 32, and in fact maintain it under operating conditions at all times.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A gain stage for use in an amplifier which provides an output signal, said gain stage comprising:
   a first transistor having a base, an emitter and a collector, said base being coupled to an input signal applied to said gain stage and said emitter being coupled to a first source of operating potential;
   a second transistor having a base, an emitter and a collector, said collector being coupled to the collector of said first transistor for providing said output signal, said emitter being coupled to a second source of operating potential; and
   a third transistor having a base, an emitter and a collector, said emitter being coupled to said input signal, said base being coupled to a source of bias voltage, and said collector being coupled to said second operating potential and the base of said second transistor for providing an amplified level shifted drive signal thereto allowing the output signal to swing substantially between the first and second sources of operating potential; and
   a fourth transistor having a base, an emitter and a collector, said base being coupled to said input signal, said collector being coupled to said second source of operating potential, and said emitter being coupled to both said first source of operating potential and the base of said first transistor.

2. The gain stage of claim 1, wherein said collector of said third transistor is coupled to said second source of operating potential through a resistor for generating a voltage which drives the base of said second transistor.

3. The gain stage of claim 1, wherein said collector of said third transistor is coupled to said base of said second transistor through a voltage buffer.

4. The gain stage of claim 3, wherein said voltage buffer comprises a fifth transistor having a base, an emitter and a collector, said base being coupled to said collector of said third transistor, said emitter being coupled to said base of said second transistor, said collector being coupled to said first source of operating potential.

5. The gain stage of claim 3, wherein said voltage buffer comprises a fifth transistor having a base, an emitter and a collector, said base being coupled to said collector of said third transistor, said emitter being coupled to said base of said second transistor, said collector being coupled to said second source of operating potential.

6. The gain stage of claim 1, wherein said source of bias voltage generates a bias voltage of 2 $V_{be}$.

7. The gain stage of claim 6, wherein said source of bias voltage comprises a pair of series coupled diodes having a predetermined current flowing therethrough, said diodes coupled between said base of said third transistor and said first source of operating potential.

8. The gain stage of claim 1, wherein said first transistor further comprises a second emitter being coupled to said base of said fourth transistor for providing a saturation clamp for said first transistor.

9. The gain stage of claim 1 further comprising a capacitor coupled between the base of said first transistor and the collector of said third transistor for providing feed forward stability compensation.

10. The gain stage of claim 1 further comprising a resistor coupled between the base of said second transistor and the collector of said third transistor for providing stability compensation.

11. The gain stage of claim 1, wherein said second transistor comprises a second emitter being coupled to the collector of said third transistor for providing a saturation clamp for said second transistor.

12. A gain stage for use in an amplifier which provides an output signal, said gain stage comprising:
a first transistor having a base, an emitter and a collector, said base being coupled to an input signal applied to said gain stage and said emitter being coupled to a first voltage source;
a second transistor having a base, an emitter and a collector, said collector being coupled to the collector of said first transistor for providing said output signal, said emitter being coupled to a second voltage source; and
a translinear bias voltage source coupled to both the base of said first transistor and the base of said second transistor, said bias voltage source operable for defining the collector current of said first transistor and for providing an amplified level shifted drive signal to said second transistor to force an equivalent collector current in said second transistor thereby allowing the output signal to swing substantially between the first and second voltage sources.

13. The gain stage of claim 12, wherein said translinear bias voltage source comprises a third transistor having a base, an emitter and a collector, said emitter being coupled to said input signal, said base being driven by a 2 $V_{be}$ voltage source, and said collector being coupled to said second voltage source and the base of said second transistor for providing said drive signal thereto.

14. The gain stage of claim 13, wherein said collector of said third transistor is coupled to said second voltage source through a resistor for generating a voltage which drives the base of said second transistor.

15. The gain stage of claim 13, wherein said collector of said third transistor is coupled to said base of said second transistor through a voltage buffer.

16. The gain stage of claim 15, wherein said voltage buffer comprises a fourth transistor having a base, an emitter and a collector, said base being coupled to said collector of said third transistor, said emitter being coupled to said base of said second transistor, said collector being coupled to said first voltage source.

17. The gain stage of claim 15, wherein said voltage buffer comprises a fourth transistor having a base, an emitter and a collector, said base being coupled to said collector of said third transistor, said emitter being coupled to said base of said second transistor, said collector being coupled to said second voltage source.

18. The gain stage of claim 13, wherein said 2 $V_{be}$ voltage source comprises a pair of series coupled diodes or diode connected transistors having a predetermined current flowing therethrough, said diodes or diode connected transistors coupled between said base of said third transistor and said first voltage source.

19. The gain stage of claim 12 further comprising a third transistor having a base, an emitter and a collector, said base being coupled to said input signal, said collector being coupled to said second voltage source, and said emitter being coupled to both said first voltage source and the base of said first transistor.

20. A gain stage for use in an amplifier which provides an output signal, said gain stage comprising:
a voltage buffer having an input and an output, said input being coupled to an input signal applied to said gain stage;
a first transistor having a base, an emitter and a collector, said base being coupled to said output of said voltage buffer, and said emitter being coupled to a first source of operating potential;
a second transistor having a base, an emitter and a collector, said collector being coupled to the collector of said first transistor for providing said output signal, said emitter being coupled to a second source of operating potential; and
a third transistor having a base, an emitter and a collector, said emitter being coupled to said input signal, said base being coupled to a source of bias voltage, and said collector being coupled to said second operating potential and the base of said second transistor for providing an amplified level shifted drive signal thereto allowing the output signal to swing substantially between the first and second sources of operating potential.

21. The gain stage of claim 20, wherein said collector of said third transistor is coupled to said second source of operating potential through a resistor for generating a voltage which drives the base of said second transistor.

22. The gain stage of claim 20, wherein said collector of said third transistor is coupled to said base of said second transistor through a second voltage buffer.

23. The gain stage of claim 22, wherein said second voltage buffer comprises a fourth transistor having a base, an emitter and a collector, said base being coupled to said collector of said third transistor, said emitter being coupled to said base of said second transistor, said collector being coupled to said first source of operating potential.

24. The gain stage of claim 22, wherein said second voltage buffer comprises a fourth transistor having a base, an emitter and a collector, said base being coupled to said collector of said third transistor, said emitter being coupled to said base of said second transistor, said collector being coupled to said second source of operating potential.

25. The gain stage of claim 20, wherein said source of bias voltage generates a bias voltage of 2 $V_{be}$.

26. The gain stage of claim 25, wherein said source of bias voltage comprises a pair of series coupled diodes having a predetermined current flowing therethrough, said diodes coupled between said base of said third transistor and said first source of operating potential.

27. The gain stage of claim 20, wherein said first voltage buffer comprises a fourth transistor having a base, an emitter and a collector, said base being coupled to said input signal, said collector being coupled to said second source of operating potential, and said emitter being coupled to both said first source of operating potential and the base of said first transistor.

28. The gain stage of claim 27, wherein said first transistor further comprises a second emitter being coupled to said base of said fourth transistor for providing a saturation clamp for said first transistor.

29. The gain stage of claim 20 further comprising a capacitor coupled between the base of said first transistor and the collector of said third transistor for providing feed forward stability compensation.

30. The gain stage of claim 20 further comprising a resistor coupled between the base of said second transistor and the collector of said third transistor for providing stability compensation.

31. The gain stage of claim 20, wherein said second transistor comprises a second emitter being coupled to the collector of said third transistor for providing a saturation clamp for said second transistor.

* * * * *